(12) United States Patent
Horak et al.

(10) Patent No.: US 9,515,070 B2
(45) Date of Patent: Dec. 6, 2016

(54) REPLACEMENT METAL GATE (71) Applicant: International Business Machines Corporation, Armonk, NY (US)

(72) Inventors: David V. Horak, Essex Junction, VT (US); Effendi Leobandung, Wappingers Falls, NY (US); Stefan Schmitz, Ballston Spa, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/956,524

(22) Filed: Dec. 2, 2015

(65) Prior Publication Data

US 2016/0086944 A1  Mar. 24, 2016

Related U.S. Application Data (62) Division of application No. 14/223,612, filed on Mar. 24, 2014, now Pat. No. 9,231,080.

(51) Int. Cl.
  *H01L 27/088* (2006.01)
  *H01L 29/49* (2006.01)
  *H01L 29/51* (2006.01)
  *H01L 29/66* (2006.01)
  *H01L 29/78* (2006.01)

(52) U.S. Cl.
  CPC ....... *H01L 27/0886* (2013.01); *H01L 29/4958* (2013.01); *H01L 29/4966* (2013.01); *H01L 29/517* (2013.01); *H01L 29/66545* (2013.01); *H01L 29/66795* (2013.01); *H01L 29/785* (2013.01)

(58) Field of Classification Search
  None
  See application file for complete search history.

(56) References Cited

U.S. PATENT DOCUMENTS

| | | | |
|---|---|---|---|
| 2010/0311231 A1* | 12/2010 | Thei | H01L 21/823842 438/587 |
| 2013/0161762 A1* | 6/2013 | Kelly | H01L 29/66795 257/401 |
| 2013/0200470 A1* | 8/2013 | Liu | H01L 29/66795 257/408 |

* cited by examiner

*Primary Examiner* — Khaja Ahmad
(74) *Attorney, Agent, or Firm* — Law Offices of Ira D. Blecker, P.C.

(57) ABSTRACT

A semiconductor structure which includes: a fin on a semiconductor substrate; and a gate structure wrapped around the fin. The gate structure includes: spaced apart spacers to form an opening, the spacers being perpendicular to the fin, the spacers having a height with respect to the fin; a high-k dielectric material in the opening and over the fin, the high-k dielectric material in contact with the spacers and a bottom of the opening; a work function metal in contact with the high-k dielectric material that is over the fin, the spacers and the bottom of the opening, the work function metal that is in contact with the high-k dielectric material having a height in the opening that is less than the height of the spacers, the high-k dielectric material and the work function metal only partially filling the opening; and a metal completely filling the opening.

20 Claims, 13 Drawing Sheets

REPLACEMENT METAL GATE

RELATED APPLICATION

The present application is a divisional patent application of U.S. patent application Ser. No. 14/223,612 entitled "REPLACEMENT METAL GATE", filed Mar. 24, 2014, the disclosure of which is incorporated by reference herein.

BACKGROUND

The present invention relates to FinFET structures and, more particularly, relates to the formation of the metal gate in a replacement metal gate process.

FinFET devices and FinFET structures are nonplanar devices and structures typically built on a bulk semiconductor or semiconductor on insulator substrate. The FinFET devices are field effect transistors which may comprise a vertical semiconductor fin, rather than a planar semiconductor surface, having a single, double or triple gate wrapped around the fin. In an effort to provide for continued scaling of semiconductor structures to continuously smaller dimensions while maintaining or enhancing semiconductor device performance, the design and fabrication of semiconductor fin devices and semiconductor fin structures has evolved within the semiconductor fabrication art.

BRIEF SUMMARY

The various advantages and purposes of the exemplary embodiments as described above and hereafter are achieved by providing, according to a first aspect of the exemplary embodiments, a semiconductor structure which includes: at least one fin on a semiconductor substrate; and a gate structure wrapped around the at least one fin. The gate structure includes: spaced apart spacers to form an opening, the spacers being perpendicular to the at least one fin, the spacers having a height with respect to the at least one fin; a high dielectric constant (high-k) dielectric material in the opening and over the at least one fin, the high-k dielectric material in contact with the spacers and a bottom of the opening; a work function metal in contact with the high-k dielectric material that is over the at least one fin, the spacers and the bottom of the opening, the work function metal that is in contact with the high-k dielectric material having a height in the opening that is less than the height of the spacers, the high-k dielectric material and the work function metal only partially filling the opening; and a metal completely filling the opening.

According to a second aspect of the exemplary embodiments, there is provided a semiconductor structure which includes: a plurality of fins on a semiconductor substrate; and a gate structure wrapped around each of the fins. The gate structure includes: spaced apart spacers to form an opening, the spacers being perpendicular to the at least one fin, the spacers having a height with respect to the at least one fin; a high dielectric constant (high-k) dielectric material in the opening and over the at least one fin, the high-k dielectric material in contact with the spacers and a bottom of the opening; a work function metal in contact with the high-k dielectric material that is over the at least one fin, the spacers and the bottom of the opening, the work function metal that is in contact with the high-k dielectric material having a height in the opening that is less than the height of the spacers, the high-k dielectric material and the work function metal only partially filling the opening; and a metal completely filling the opening.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 6A to 11A and 6B to 11B illustrate a first exemplary replacement metal gate process wherein:

FIGS. 12A to 15A and 12B to 15B illustrate a second exemplary replacement metal gate process wherein:

DETAILED DESCRIPTION

Referring now to FIGS. 1A to 1D, there are shown various exemplary starting structures for the present exemplary embodiments relating to FinFET structures.

There are various ways to manufacture the fins known to those skilled in the art. One particular preferred method of manufacturing is a process called sidewall image transfer process.

In the sidewall image transfer process, a hard mask layer may be patterned and then an underlying amorphous silicon layer may be etched followed by a conformal layer of nitride over the patterned amorphous silicon. The conformal layer of nitride may then be etched to form nitride sidewall spacers adjacent to the patterned amorphous silicon. The patterned amorphous silicon may then be etched to leave the nitride sidewall spacers which may then be used as a mask to etch the underlying semiconductor substrate. After etching, the nitride sidewall spacers may be removed to result in three dimensional (3D) fins on the semiconductor substrate.

The fins may be on a bulk semiconductor substrate or a semiconductor on insulator (SOI) substrate. FIGS. 1A to 1D illustrate four exemplary embodiments of a starting structure. FIGS. 1A to 1D are only illustrative and are not meant to be exclusive.

Figure 1A:
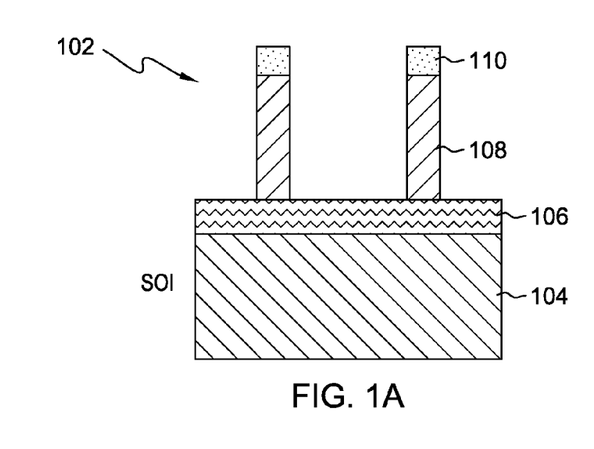
FIGS. 1A to 1D illustrate various exemplary starting structures for the present exemplary embodiments.

In FIG. 1A, a starting structure 102 for a dual-gate FinFET is illustrated. The semiconductor substrate is an SOI substrate and includes a bulk semiconductor 104, which may be for example silicon, and an insulating layer 106. The insulating layer 106 may be for example an oxide. Insulating layer 106 is often referred to as a buried oxide layer or simply BOX. Fins 108 have been formed from the top semiconductor layer, usually silicon, that is part of an SOI substrate. Fins 108 may have an insulating layer 110 on top of each of the fins 108 so that when a gate is formed on the fins 108, only contact is made with the sides of the fins 108.

Figure 1B:
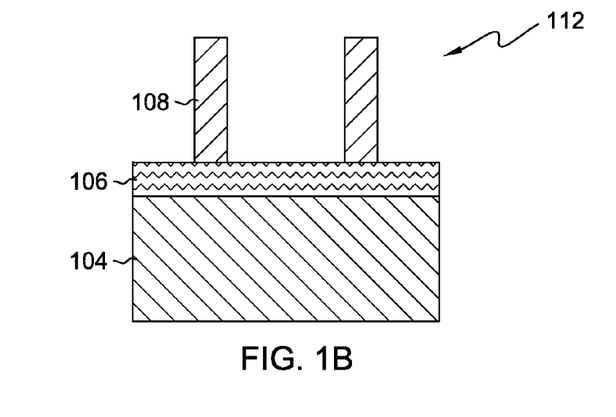

In FIG. 1B, a starting structure 112 for a tri-gate FinFET is illustrated. Starting structure 112 is identical to starting structure 102 except there is no insulating layer on the top of the fins 108. Accordingly, when a gate is formed on the fins 108, contact is made with the sides and top of the fins 108.

Figure 1C:
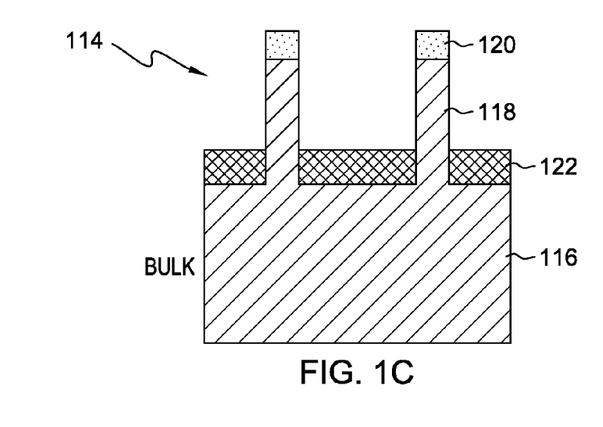

In FIG. 1C, a starting structure 114 for a dual-gate FinFET is illustrated. The semiconductor substrate is a bulk substrate 116 which may be for example silicon. Fins 118 have been formed from the bulk substrate 116. Fins 118 may have an insulating layer 120 on top of each of the fins 118 so that when a gate is formed on the fins 118, only contact is made with the sides of the fins 118. Starting structure 114 may further include an insulating layer 122, such as an oxide, between the fins 118.

Figure 1D:
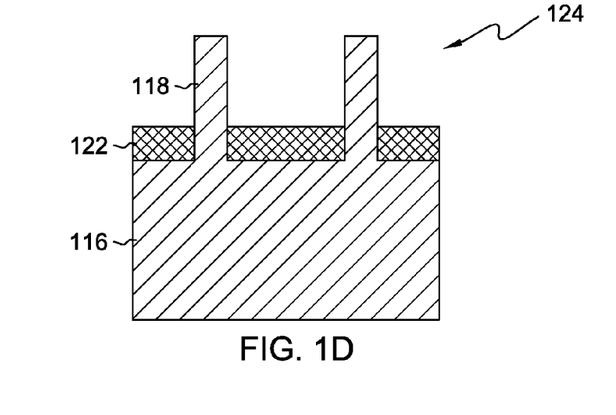

In FIG. 1D, a starting structure 124 for a tri-gate FinFET is illustrated. Starting structure 124 is identical to starting structure 114 except there is no insulating layer on the top of the fins 118. Accordingly, when a gate is formed on the fins 118, contact is made with the sides and top of the fins 118.

In the following description of the exemplary embodiments that follows, the insulating layers 110 and 120 shown in FIGS. 1A and 1C and insulating layer 122 shown in FIGS. 1C and 1D are not shown for clarity but it should be understood that such insulating layers may be present in the FinFET structures described hereafter.

Figure 2:
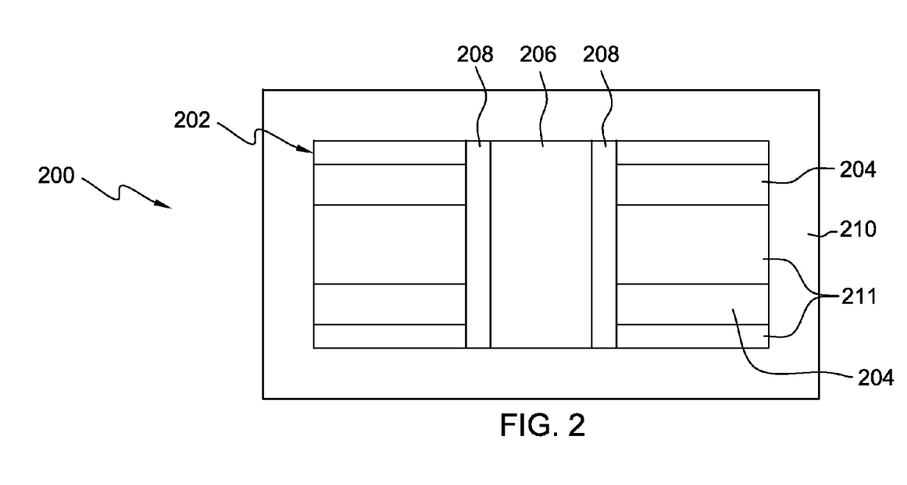
FIG. 2 is a plan view of a FinFET structure comprising a plurality of FinFETs having a dummy gate.

Referring now to FIG. 2, there is illustrated a plan view of a starting FinFET structure 200 comprising a plurality of FinFETs 202. The plurality of FinFETs 202 may be N-type FinFETs (NFETS) or P-type FinFETs (PFETS). Each FinFET 202 may comprise at least one fin 204 and a gate 206 wrapped around the fin 204. As shown in FIG. 2, the FinFETs 202 may comprise a plurality of fins 204 and a corresponding gate 206 that wraps around each of the plurality of fins 204. The FinFET structure 200 may also include spacers 208 on either side of the gate 206. The FinFETs 202 may be formed on a semiconductor substrate 210. The fins 204 and semiconductor substrate 210 may be any of the exemplary starting structures illustrated in FIGS. 1A to 1D.

A source and a drain 211 may be formed between the fins 204 and not within the area covered by the spacers 208 and dummy gate 206. The source/drain 211 may also be deposited cover over the fins 204 in another exemplary embodiment.

Figure 3:
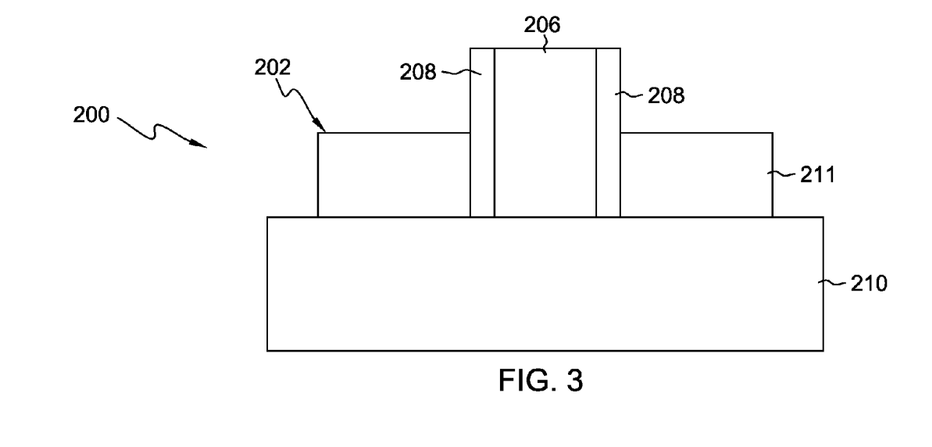
FIG. 3 is a side view of the FinFET structure of FIG. 2 illustrating a fin and a dummy gate.

FIG. 3 is a side view of the FinFET structure 200 of FIG. 2 illustrating the FinFET 202 having a gate 206 and spacers 208 on semiconductor substrate 210. Fins 204 are hidden by the source/drain 211. The semiconductor substrate 210, for purposes of illustration and not limitation, may comprise an SOI substrate or bulk substrate as described previously with respect to FIGS. 1A to 1D.

The gate 206 in FIGS. 2 and 3 is a so-called "dummy" gate in that the gate 206 is only a temporary gate and will be replaced by a permanent gate in a separate replacement gate process. Since the gate contact material may be a metal, the replacement gate process may be called a replacement metal gate process. In one exemplary process, the "dummy" gate material is undoped silicon.

Figure 4:
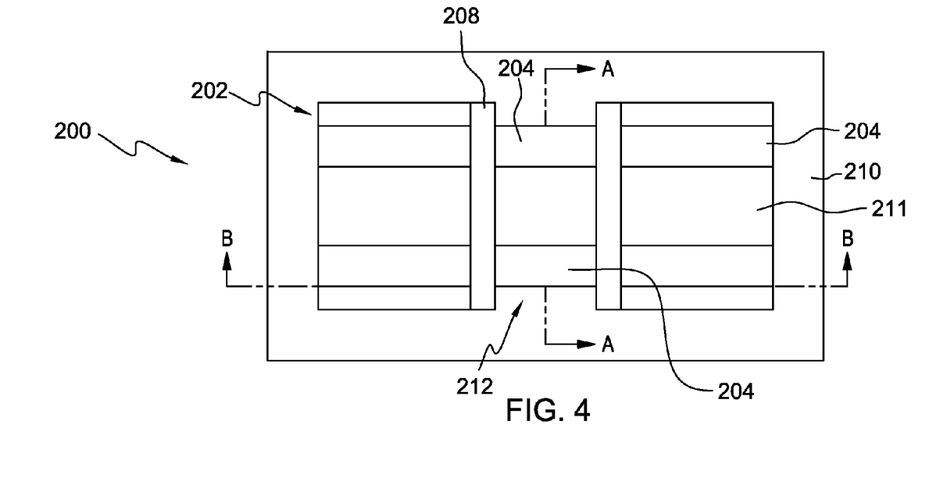
FIG. 4 is a plan view of the FinFET structure of FIGS. 2 and 3 with the dummy gate removed.
Figure 5:
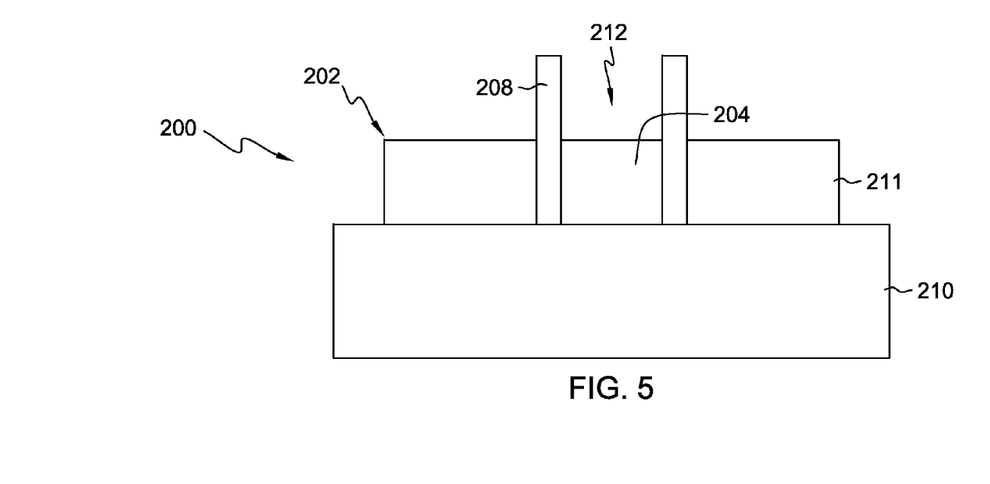
FIG. 5 is a side view of the FinFET structure of FIG. 4 with the dummy gate removed.

Referring now to FIGS. 4 and 5, dummy gate 206 has been conventionally removed by a dry etching or wet etching process to expose fins 204 between spacers 208. The dummy gate 206 may be removed by a dry etching process, such as reactive ion etching, or may be removed by wet etching by, for example, hot ammonia or TMAH (tetramethylammonium hydroxide). For purposes of illustration, the spacers 208 may be silicon nitride, boron-doped silicon nitride or carbon-doped silicon nitride. The open area 212 formerly occupied by dummy gate 206 may be replaced by a gate dielectric, work function metal (or work function metals) and metal gate contact material in a replacement metal gate process to be described hereafter. Shown within open area 212 is the fin 204.

FIGS. 6A to 11A and 6B to 11B describe a first exemplary replacement metal gate process where the "A" figures are cross-sectional views in the direction of arrows A-A in FIG. 4 and the "B" figures are cross-sectional views in the direction of arrows B-B in FIG. 4.

Figure 6A:
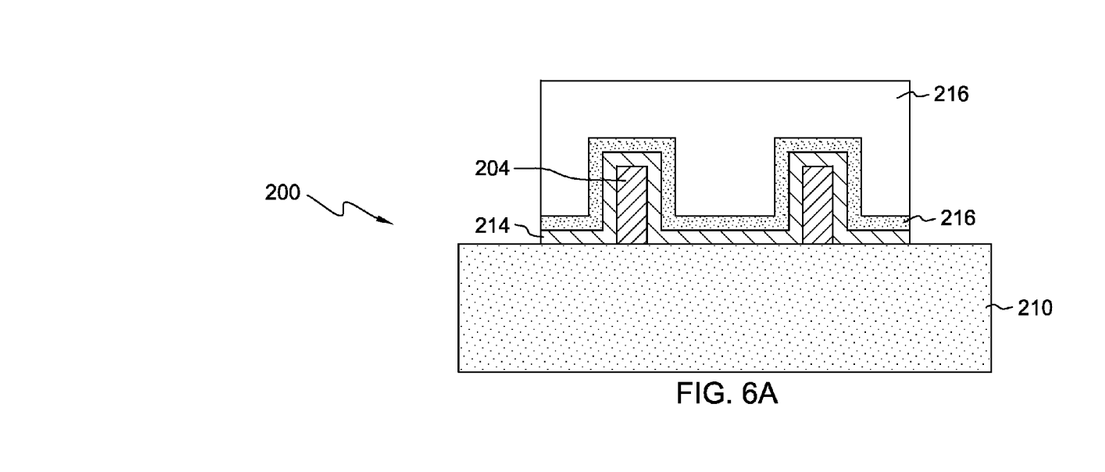
FIGS. 6A and 6B illustrate the formation of a conformal high-k dielectric material and a conformal work function metal in the opening formerly occupied by the dummy gate.
Figure 6B:
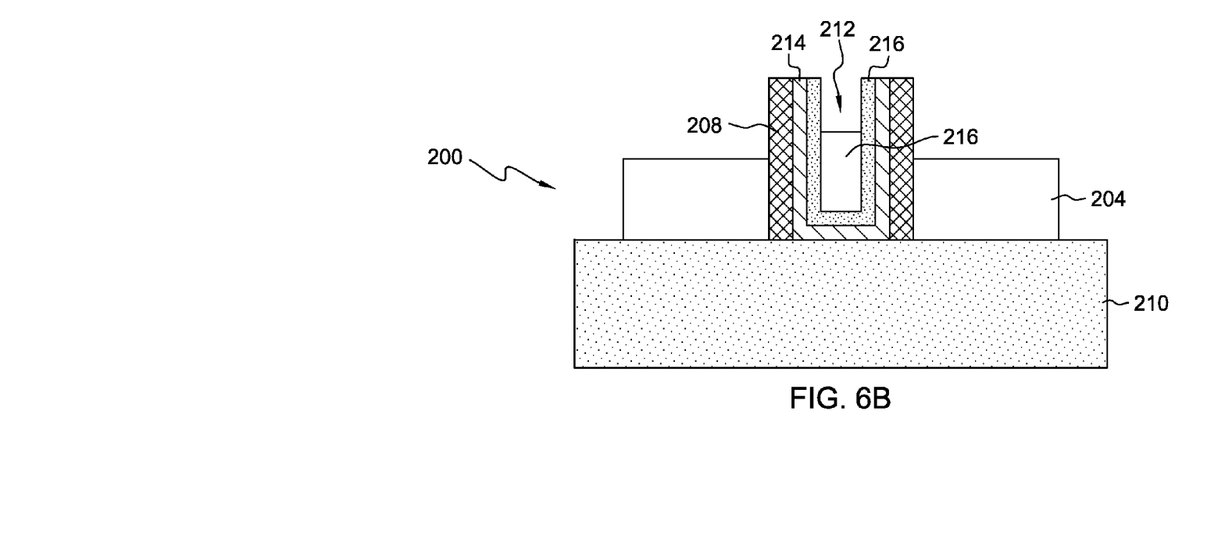

Referring now to FIGS. 6A and 6B, a high-k dielectric material 214 has been deposited in the open area 212 between the spacers 208 and on the fins 204. The high-k dielectric material 214 may also be deposited between the fins 204 (as best shown in FIG. 6A) so as to be in contact with the semiconductor substrate 210 at 218. If the semiconductor substrate 210 is an SOI substrate, the high-k dielectric material 214 may be in direct contact with the SOI substrate. The high-k dielectric material 214 may be any high-k dielectric material but is preferably hafnium oxide ($HfO_2$) and may have a thickness of less than about 2 nanometers (nm). Preferably the high-k dielectric material 214 is deposited by a conformal deposition process such as atomic layer deposition (ALD).

Subsequent to the deposition of the high-k dielectric material 214, there is deposited one or more work function metals 216 over the high-k dielectric material 214. Work function metals 216 for pFETs may include titanium nitride, tantalum, cobalt and ruthenium, just to name a few. Work function metals 216 for nFETS may include aluminum-doped alloys such as TiAlN, TiAlC, TaC and TaN, just to name a few. The work function metal 216 is also deposited in the open area 212 on the fins 204, between the fins 204 and between the spacers 208. The thickness of the work function metal 216 may be less than about 5 nm. Preferably the work function metal 216 is deposited by a conformal deposition process such as ALD.

The deposition of the high-k dielectric material 214 and work function metal 216 only partially fills the opening 212 as there must be a space for the metal gate contact material.

Figure 7A:
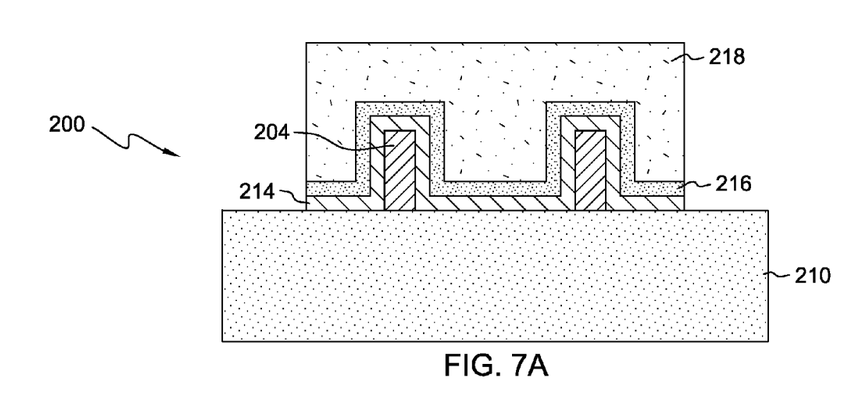
FIGS. 7A and 7B illustrate the formation of an organic material to fill the remainder of the opening shown in FIGS. 6A and 6B.
Figure 7B:
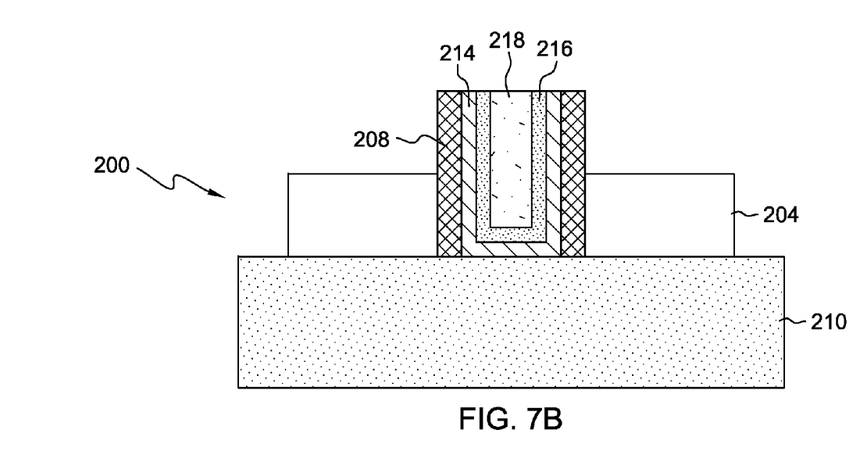

Referring now to FIGS. 7A and 7B, an organic material 218 may be deposited to fill the portion of the opening 212 that is not occupied by the high-k dielectric layer 214 and work function metal 216. The organic material 218 may be an organic dielectric layer which may also be referred to as an organic planarization layer. Some examples of an organic dielectric layer may include, for purposes of illustration and not limitation, a spin-on organic dielectric layer such as HM8500, commercially available from JSR Micro, Inc. (1280 North Mathilda Avenue, Sunnyvale, Calif. 94089) or a spin-on organic dielectric layer commercially available from Shin-Etsu Chemical Company, Ltd. (6-1, Ohtemachi 2-chome, Chiyoda-ku, Tokyo 100-0004, Japan), such as the ODL series, i.e., ODL301 or ODL102. The organic dielectric layer is typically not photosensitive. Alternatively, the organic material 218 may be a photoresist material.

Figure 8A:
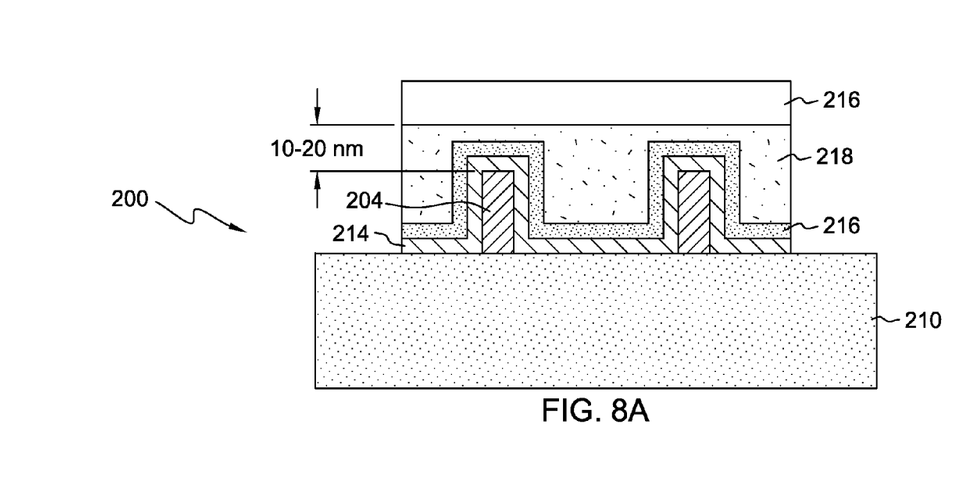
FIGS. 8A and 8B illustrate the partial removal of the organic material.
Figure 8B:
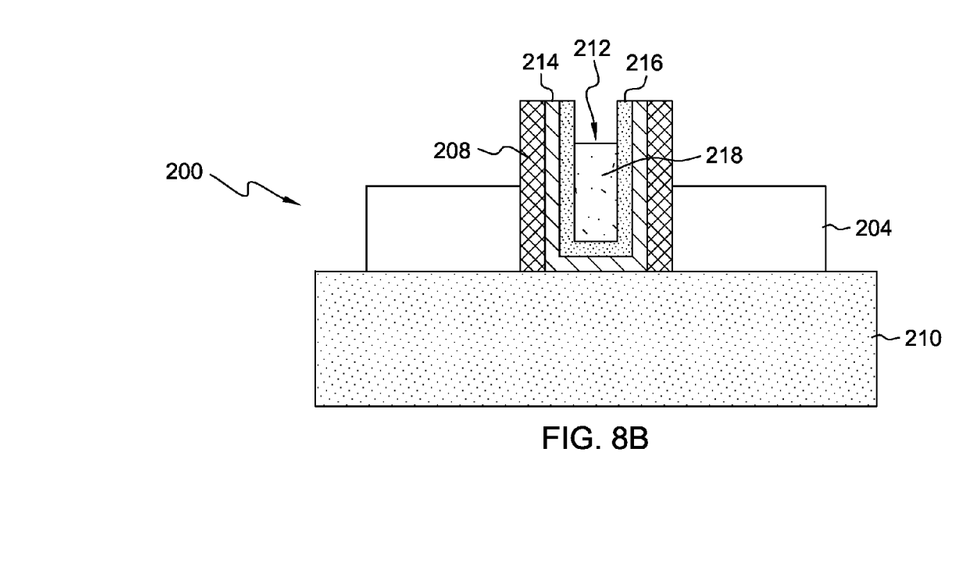

In a next process step, as shown in FIGS. 8A and 8B, the organic material 218 may be partially removed from the opening 212 by an etching process, such as reactive ion etching using nitrogen and hydrogen chemistry. The organic material 218 after etching should cover the fins 204 by about 10 to 20 nm as best shown in FIG. 8A which also ensures coverage over the work function metal 216 on the fins 204 and the high dielectric layer 214 on the fins 204.

Figure 9A:
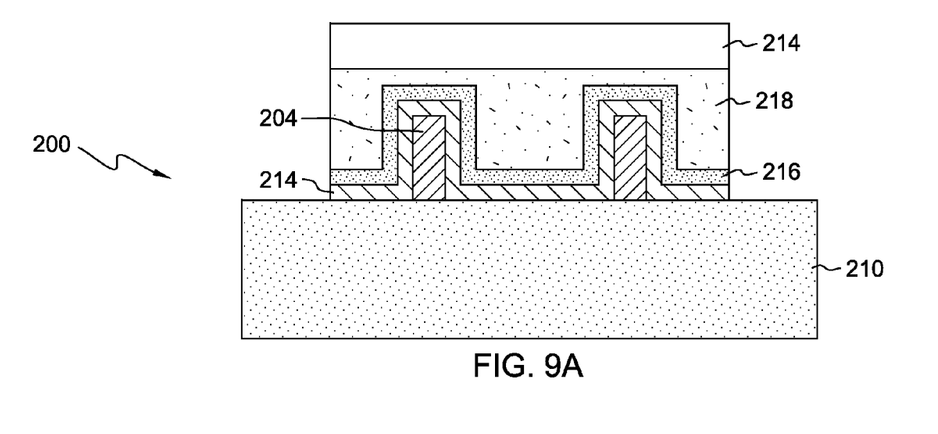
FIGS. 9A and 9B illustrate the etching of the work function metal to be at approximately the same level as the organic material.
Figure 9B:
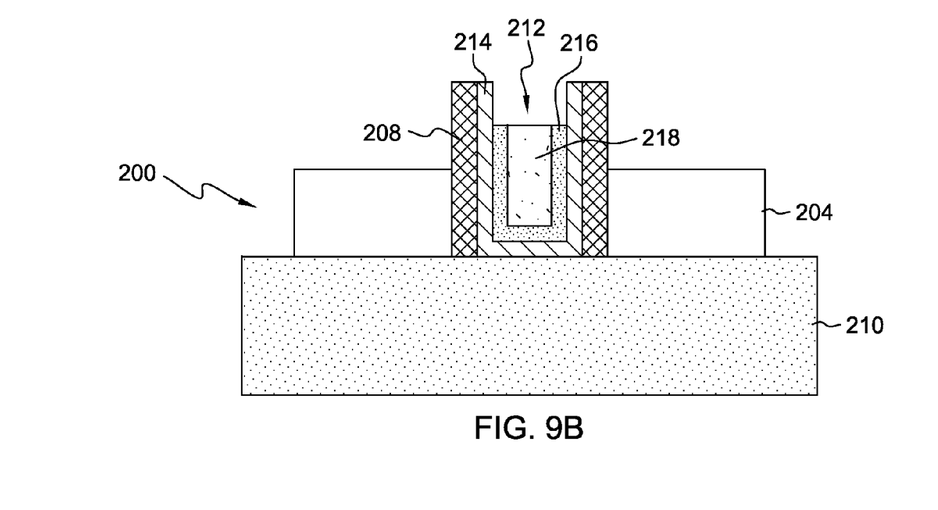

Thereafter, the portion of the work function metal 216 that is now exposed is etched by a wet or dry process. The dry process may be a reactive ion etching (RIE) process. A wet etching process may include etching with a solution of ammonia ($NH_4$) plus hydrogen peroxide ($H_2O_2$) and water. The etching process should be selective to the organic material 218, the spacers 208, high-k dielectric material 214 and any oxide on the FinFET structure 200 so that only the work function metal 216 is etched back. At this point in the process, the work function metal 216 may be at the same level as the organic material 218 as shown in FIGS. 9A and 9B.

Figure 10A:
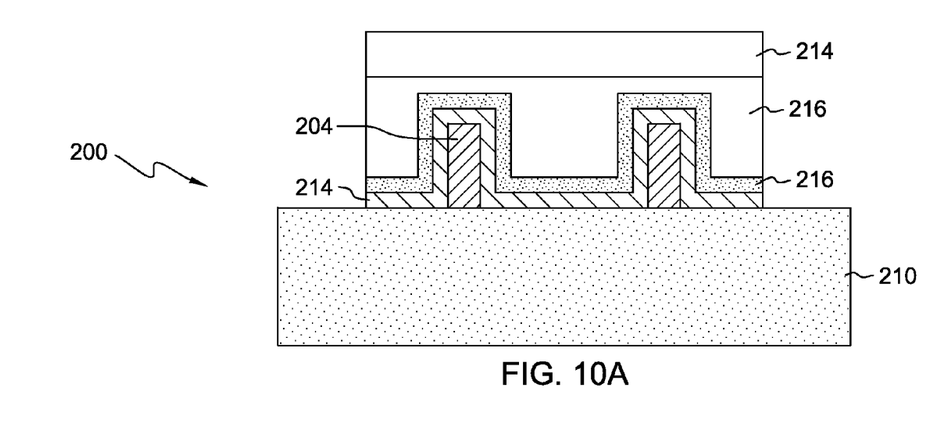
FIGS. 10A and 10B illustrate the removal of the remaining organic material.
Figure 10B:
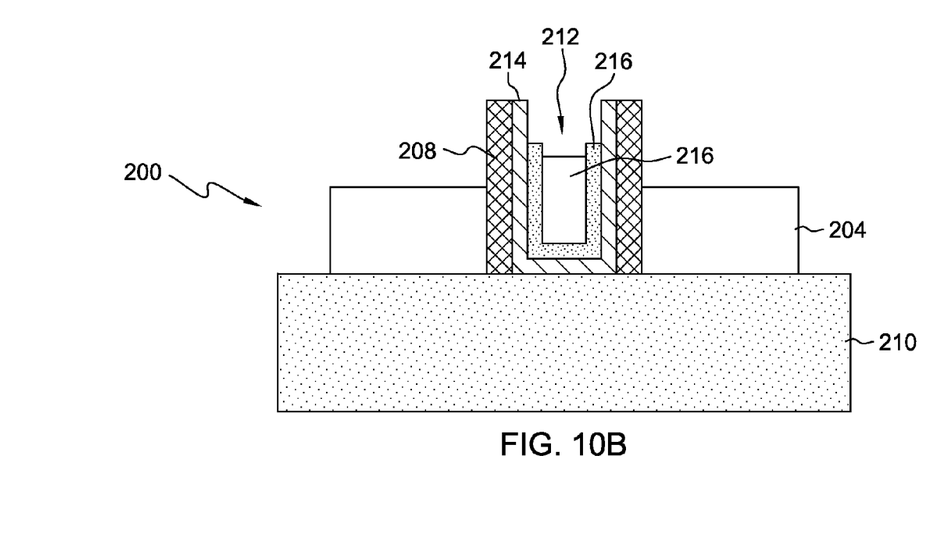

The organic material 218 may be stripped by a process such as RIE to result in the structure shown in FIGS. 10A and 10B. This process also enlarges the open area 212 from FIGS. 9A and 9B. It is noted that the high-k dielectric material 214 and work function metal 216 remain on the fins 204 as well as between the fins 204 since they were protected by the organic material 218 during the etching of the work function metal 216.

Figure 11A:
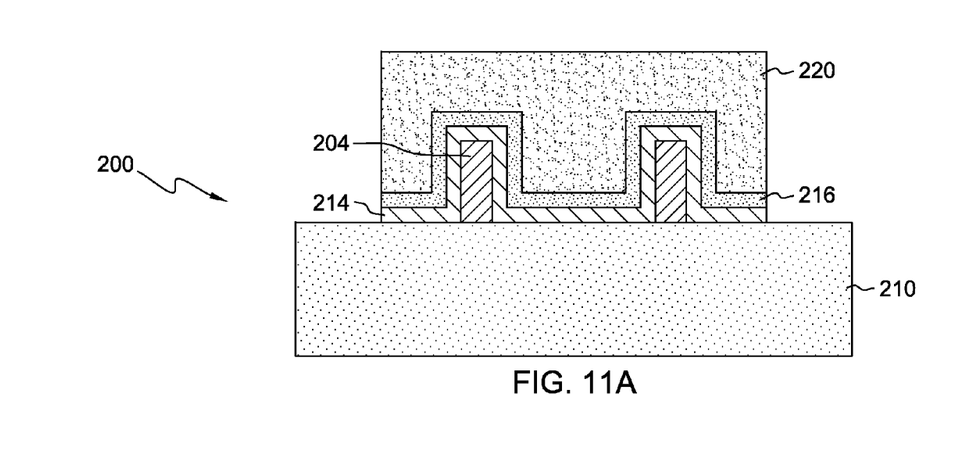
FIGS. 11A and 11B illustrate the formation of a gate metal to fill the opening.
Figure 11B:
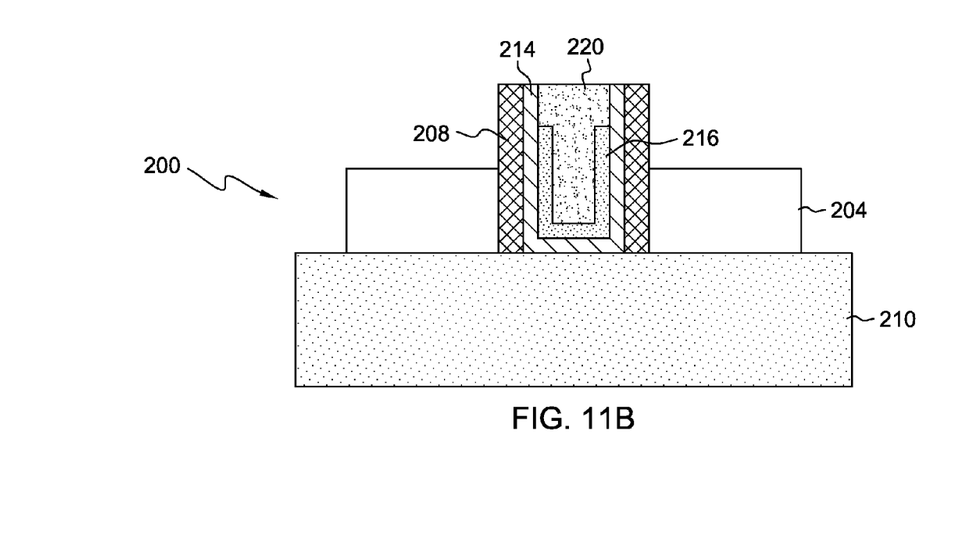

Referring now to FIGS. 11A and 11B, the opening 212 is filled with a metal 220 such as aluminum or tungsten to form the gate contact material to complete the replacement metal gate process. Any overburden of metal 220 may be removed by a process such as chemical mechanical polishing (CMP). The combination of the high-k dielectric material 214, work function metal 216 and metal gate contact material 220 form the replacement metal gate.

Further processing may now take place to complete the FinFET structure 200.

FIGS. 12A to 16A and 12B to 16B describe a second exemplary replacement metal gate process where the "A" figures are cross-sectional views in the direction of arrows A-A in FIG. 4 and the "B" figures are cross-sectional views in the direction of arrows B-B in FIG. 4.

Figure 12A:
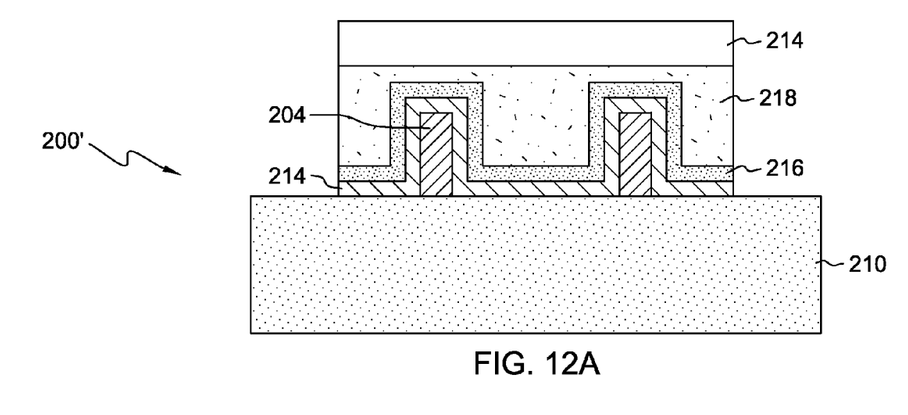
FIGS. 12A and 12B are identical to FIGS. 9A and 9B and illustrate the etching of the work function metal to be at approximately the same level as the organic material.
Figure 12B:
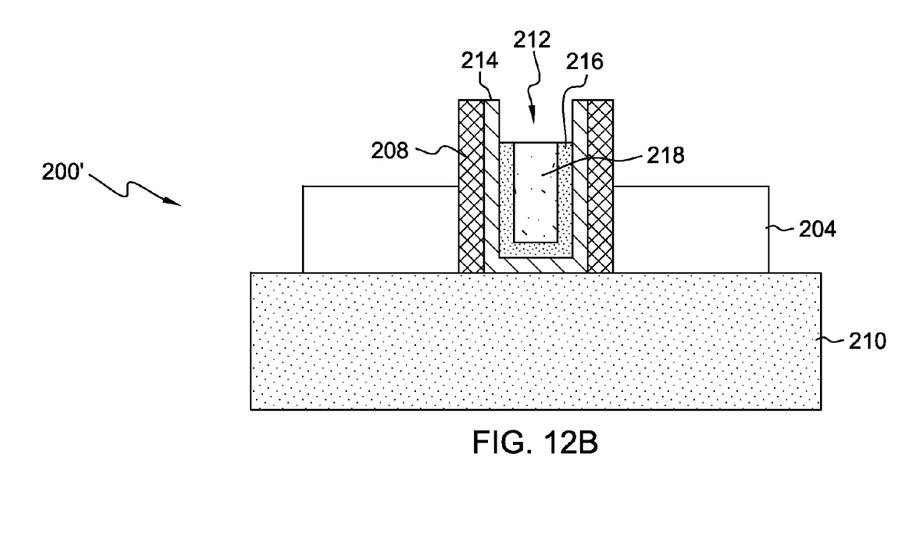

FIGS. 12A and 12B pertaining to FinFET structure 200' are identical to FIGS. 9A and 9B pertaining to FinFET structure 200 where the portion of the work function metal 216 that is now exposed is etched by a wet or dry process. The dry process may be a reactive ion etching (RIE) process. A wet etching process may include etching with a solution of ammonia ($NH_4$) plus hydrogen peroxide ($H_2O_2$) and water. The etching process should be selective to the organic material 218, the spacers 208, high-k dielectric material 214 and any oxide on the FinFET structure 200 so that only the work function metal 216 is etched back. At this point in the process, the work function metal 216 may be at the same level as the organic material 218 as shown in FIGS. 12A and 12B.

Up until this point in the process, the processing of FinFET structure 200' has been identical to FinFET structure 200.

Figure 13A:
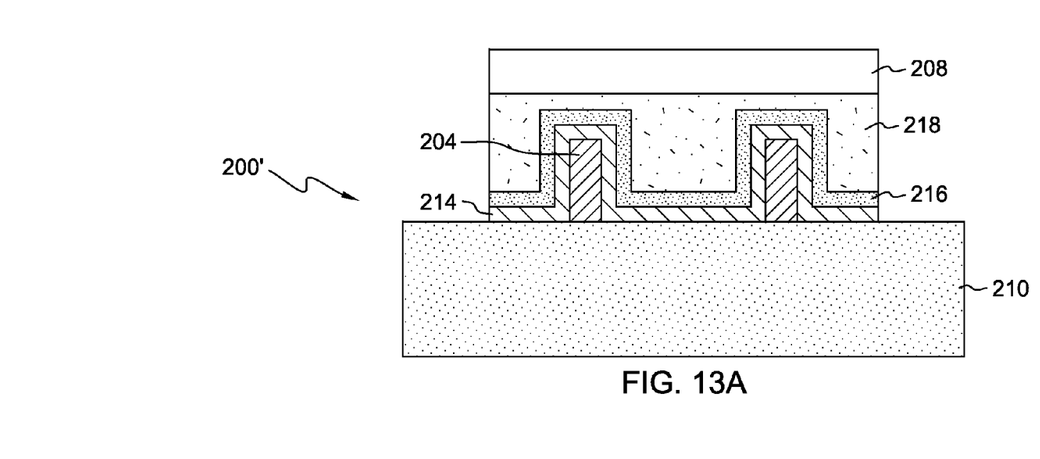
FIGS. 13A and 13B illustrate the etching of the high-k dielectric material to be at approximately the same level as the work function metal and the organic material.
Figure 13B:
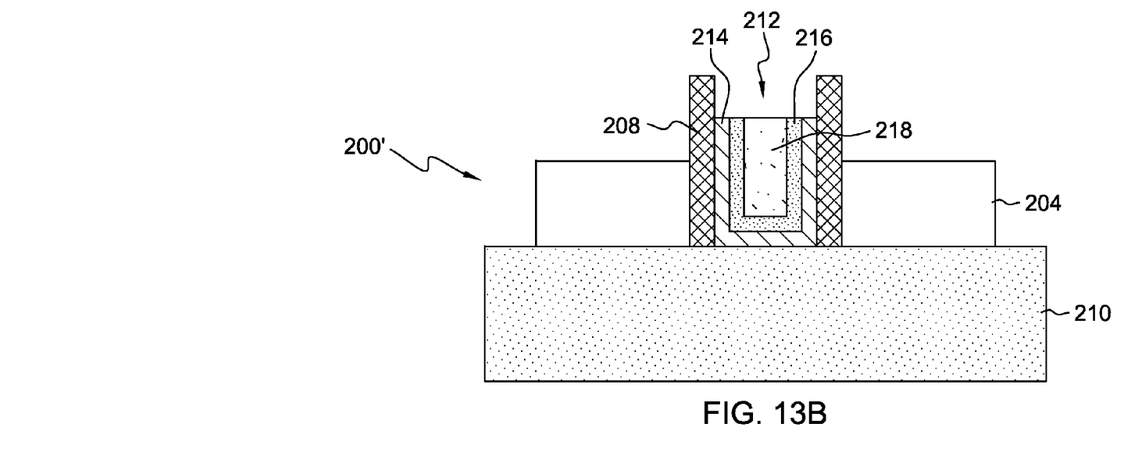

Referring now to FIGS. 13A and 13B, the high-k dielectric material 216 is etched selective to the organic material 218, the spacers 208, the work function metal 216 and any oxide on the FinFET structure 200 so that only the high-k dielectric material 214 is etched back. A chlorine-based reactive ion etching dry etching process or a hydrochloric acid (HCl)-based wet etching process may be used to etch the high-k dielectric material. At this point in the process, the high-k dielectric material 214 and the work function metal 216 may be at the same level as the organic material 218 as shown in FIGS. 13A and 13B.

Figure 14A:
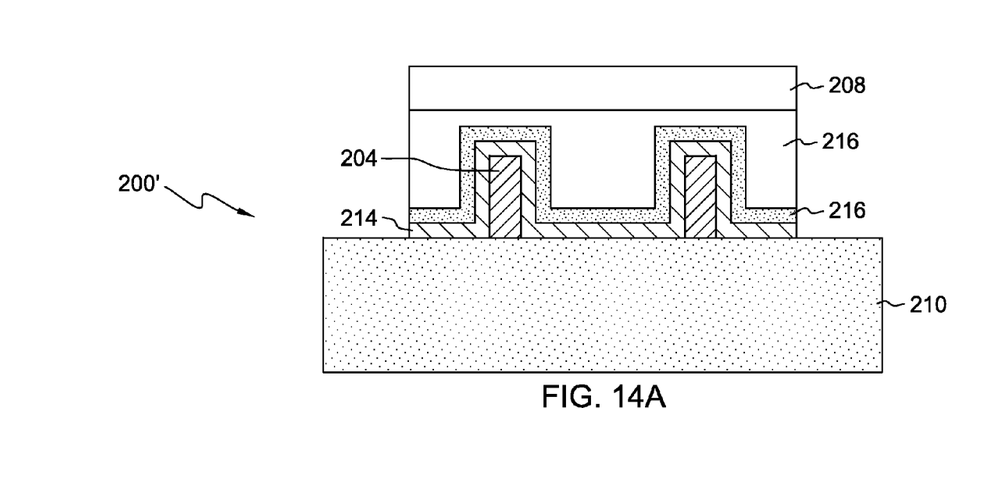
FIGS. 14A and 14B illustrate the removal of the remaining organic material.
Figure 14B:
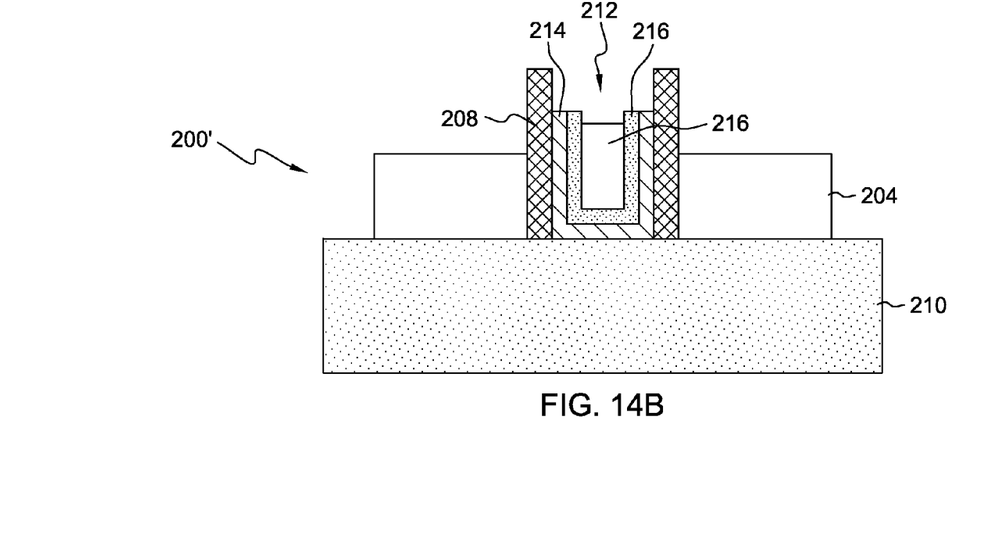

The organic material 218 may be stripped by a process such as RIE to result in the structure shown in FIGS. 14A and 14B. This process also enlarges the opening 212 from FIGS. 13A and 13B. It is noted that the high-k dielectric material 214 and work function metal 216 remain on the fins 204 as well as between the fins 204 since they were protected by the organic material 218 during the etching of the work function metal 216 and high-k dielectric material 214.

Figure 15A:
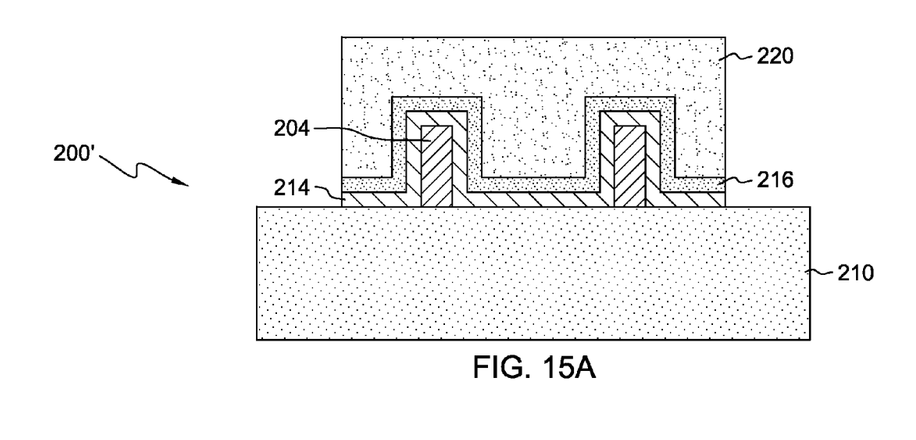
FIGS. 15A and 15B illustrate the formation of a gate metal to fill the opening.
Figure 15B:
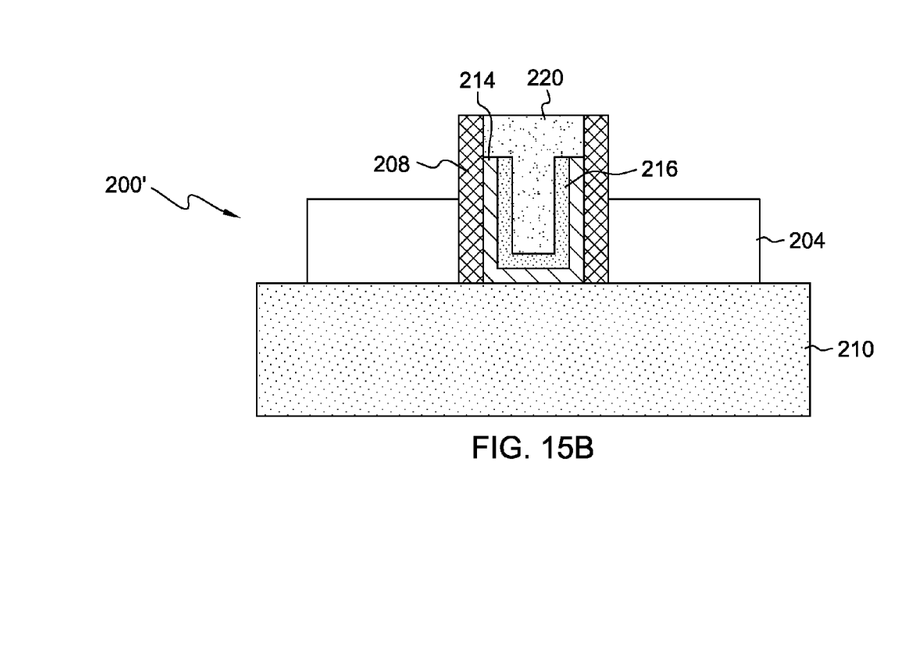

Referring now to FIGS. 15A and 15B, the opening 212 is filled with a metal 220 such as aluminum or tungsten to form the gate contact material to complete the replacement metal gate process. Any overburden of metal 220 may be removed by a process such as chemical mechanical polishing (CMP). The combination of the high-k dielectric material 214, work function metal 218 and metal gate contact material 220 form the replacement metal gate.

Further processing may now take place to complete the FinFET structure 200'.

In future semiconductor devices, the gate length (distance between source and drain) may be less than 20 nm which makes the gate contact material fill in the replacement gate trench very difficult. Further, the aspect ratio in a FinFET structure becomes larger which also results in a challenge for gate contact material fill. Poor gate contact material fill may cause high gate resistance which may also degrade device AC performance. The exemplary embodiments provide a solution to the current problem of gate contact material fill by etching back the work function metal, and in an alternative embodiment the high dielectric constant gate dielectric as well, to open up the trench before gate contact material fill.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A semiconductor structure comprising:
 at least one fin on a semiconductor substrate; and
 a gate structure wrapped around the at least one fin, the gate structure comprising:
   spaced apart spacers wrapped around the at least one fin and extending from the semiconductor substrate to form an opening, the spacers being perpendicular to the at least one fin, the spacers having a height with respect to the semiconductor substrate, and a top of each of the spacers extending above the at least one fin and the semiconductor substrate;

a high dielectric constant (high-k) dielectric material in the opening and wrapped around the at least one fin, the high-k dielectric material having a first portion in contact with the spacers and a second portion in contact with a bottom of the opening;

a work function metal in contact with the first and second portions of the high-k dielectric material that is wrapped around the at least one fin, the spacers and the bottom of the opening, wherein the work function metal that is in contact with the first portion of the high-k dielectric material having a height in the opening that is less than a height of the spacers, the topmost surfaces of the spacers are at higher elevation than topmost surfaces of the work function metal from a surface of the substrate, and the first and second portions of the high-k dielectric material and the work function metal only partially filling the opening; and a metal completely filling the opening.

2. The semiconductor structure of claim 1 wherein the first and second portions of the high-k dielectric material is a conformal layer so as to conform to the spacers and the bottom of the opening.

3. The semiconductor structure of claim 1 wherein the first portion of the high-k dielectric material is in direct contact with the spacers and second portion of the high-k dielectric material is in direct contact with the bottom of the opening.

4. The semiconductor structure of claim 1 wherein the work function metal is a conformal layer so as to conform to the spacers and the bottom of the opening.

5. The semiconductor structure of claim 4 wherein the work function metal is directly on the first and second portions of the high-k dielectric material.

6. The semiconductor structure of claim 1 wherein the work function metal in contact with the first portion of the high-k dielectric material having a height less than that of a top of the first portion of the high-k dielectric layer.

7. The semiconductor structure of claim 1 wherein the work function metal is selected from the group of materials consisting of titanium nitride, tantalum, cobalt, ruthenium, TiAlN, TiAlC, TaC and TaN.

8. The semiconductor structure of claim 1 wherein the first portion of the high-k dielectric material having a height in the opening that is less than the tops of the spacers.

9. The semiconductor structure of claim 8 wherein the first portion of the high-k dielectric material and the work function metal in contact with the first portion of the high-k dielectric material are at the same height.

10. The semiconductor structure of claim 1 wherein the first portion of the high-k dielectric material and the work function metal in contact with the first portion of the high-k dielectric material are at the same height.

11. A semiconductor structure comprising:

a plurality of fins on a semiconductor substrate; and a gate structure wrapped around each of the plurality of fins, the gate structure comprising:

spaced apart spacers around each of the plurality of fins and extending from the semiconductor substrate to form an opening, the spacers being perpendicular to the at least one fin of the plurality of fins, the spacers having a height with respect to the first semiconductor substrate, and a top of each of the spacers extending above each of the plurality of fins and the semiconductor substrate;

a high dielectric constant (high-k) dielectric material in the opening and wrapped around each of the plurality of fins, the high-k dielectric material having a first portion in contact with the spacers and a second portion in contact with a bottom of the opening;

a work function metal in contact with the first and second portions of the high-k dielectric material that is over each of the plurality of fins, the spacers and the bottom of the opening, wherein the work function metal that is in contact with the first portion of the high-k dielectric material having a height in the opening that is less than a height of the spacers, the topmost surfaces of the spacers are at higher elevation than topmost surfaces of the work function metal from a surface of the substrate, and the first and second portions of the high-k dielectric material and the work function metal only partially filling the opening; and a metal completely filling the opening.

12. The semiconductor structure of claim 11 further comprising a space between each pair of the plurality of fins such that within the space, the second portion of the high-k dielectric material being in contact with the semiconductor substrate and the work function metal being in contact with the second portion of the high-k dielectric material.

13. The semiconductor structure of claim 11 wherein the first and second portions of the high-k dielectric material is a conformal layer so as to conform to the spacers and the bottom of the opening.

14. The semiconductor structure of claim 11 wherein the first and second portions of the high-k dielectric material are in direct contact with the spacers and the bottom of the opening.

15. The semiconductor structure of claim 11 wherein the work function metal is a conformal layer so as to conform to the spacers and the bottom of the opening.

16. The semiconductor structure of claim 15 wherein the work function metal is directly on the first and second portions of the high-k dielectric material.

17. The semiconductor structure of claim 11 wherein the work function metal having a height less than that of a top of the first portion of the high-k dielectric layer.

18. The semiconductor structure of claim 11 wherein the first portion of the high-k dielectric layer having a height in the opening that is less than the tops of the spacers.

19. The semiconductor structure of claim 18 wherein the first portion of the high-k dielectric material and the work function metal are at the same height.

20. The semiconductor structure of claim 11 wherein the first portion of the high-k dielectric material and the work function metal are at the same height.

* * * * *